United States Patent [19]

Ogita

[11] 4,454,607
[45] Jun. 12, 1984

[54] FM STEREOPHONIC RECEIVER WITH CPU CONTROLLED TUNING AND DEMODULATING

[75] Inventor: Minoru Ogita, Hamamatsu, Japan

[73] Assignee: Nippon Gakki Seizo Kabushiki Kaisha, Hamamatsu, Japan

[21] Appl. No.: 298,008

[22] Filed: Aug. 31, 1981

[30] Foreign Application Priority Data

Sep. 22, 1980 [JP] Japan .................................. 55-132152

[51] Int. Cl.³ ............................................... H04H 5/00
[52] U.S. Cl. ......................................... 381/7; 381/12; 381/13
[58] Field of Search ................ 179/1 G, 1 GB, 1 GC, 179/1 GD, 1 GM, 1 GN; 307/269; 329/111, 122, 123, 130, 136, 140; 455/150, 154, 156, 158, 179, 182–184, 192, 194, 222, 312; 381/3, 7, 10–16

[56] References Cited

U.S. PATENT DOCUMENTS 4,232,393 11/1980 Kumaoka et al. .............. 179/1 GD
4,291,414 9/1981 Kimura ........................... 455/184 X
4,323,731 4/1982 Hershberger ........................ 381/16

OTHER PUBLICATIONS

Hirose et al., "Application of Microcomputer to Frequency-Synthesized AM/FM Radio Tuning System", National Technical Report, vol. 25, No. 4, Aug. 1979, pp. 705–713, S03890070, 455-154.

Primary Examiner—A. D. Pellinen
Attorney, Agent, or Firm—Spensley, Horn, Jubas & Lubitz

[57] ABSTRACT

An FM stereophonic receiver is arranged so that a central processing unit assigned for selection of a broadcasting station is burdened, based on a clock pulse of the central processing unit, to generate sub-carriers synchronized with a pilot signal contained in a composite signal, for being used in multiplex demodulation, whereby to improve signal-to-noise ratio of the multiplex demodulated signals, and to simplify the circuit arrangement of the receiver.

12 Claims, 2 Drawing Figures

FM STEREOPHONIC RECEIVER WITH CPU CONTROLLED TUNING AND DEMODULATING

BACKGROUND OF THE INVENTION (a) Field of the invention

The present invention relates to an FM stereophonic receiver having a built-in central processing unit, and more particularly, it pertains to an FM stereophonic receiver having a central processing unit intended primarily for the selection of broadcasting stations and also for being used concurrently for the purpose of multiplex demodulation.

(b) Description of the prior art

FIG. 1 is a block diagram showing an example of a conventional FM stereophonic receiver provided with a built-in central processing unit (which will hereinafter be referred to briefly as CPU). In FIG. 1, an FM broadcast signal which is inputted through an antenna 1 is subjected to high frequency amplification at a front-end 2, and concurrently therewith, it is converted to IF (intermediate frequency) signal, and furthermore, it is submitted to IF amplification as well as to FM detection through an IF amplifier-FM detector circuit 3, to be derived as a composite signal containing a right-channel and a left-channel stereophonic signal and a pilot signal (i.e. a main-channel signal, a sub-channel signal and a pilot signal). Then, this composite signal is demodulated into a left-channel signal $L_0$ and a right-channel signal $R_0$ through a multiplex demodulator circuit 4. Further therefrom, these left and right-channel signals $L_0$ and $R_0$ are derived at a left-channel output terminal OUT(L) and a right-channel output terminal OUT(R) via respective low frequency amplifier circuits 5L and 5R and via respective muting gates 6L and 6R. On the other hand, a tuning PLL (Phase-locked Loop) section 7 is comprised of a PLL circuit which carries out a PLL behavior based on a reference tuning frequency, in accordance with the frequency dividing data supplied from a CPU 8, to thereby generate a tuning controlling voltage $V_T$. This tuning PLL section 7, after a tuning is once established, will maintain a certain broadcast reception based on the then-supplied frequency-dividing data, as this section 7 receives an S-curve signal $V_S$ from the IF amplifier-FM detector circuit 3. In other words, the tuning controlling voltage $V_T$ outputted from the tuning PLL section 7 is supplied to the front-end 2. By this tuning controlling voltage $V_T$, the tuning varicap diode of a high frequency amplifier circuit and a voltage-controlled oscillator (VCO) of the local oscillator circuit are controlled, and thus a station-selection is carried out. And, after the establishment of tuning, the then tuning controlling voltage $V_T$ is locked, and thus the receiving frequency at such time is locked accordingly.

The CPU 8 is so constructed that it is controlled of its program-running rate by a certain constant clock signal generated by a quartz oscillator circuit 21, and performs controlling of selection of various broadcasting stations, such as preset tuning controlling and auto-tuning controlling, in accordance with the manipulation of various switches provided on an operating panel 9, and that concurrently therewith, it also supplies such data as receiving frequency data to a frequency indicator 10, and it controls the ON/OFF of the muting gates 6L and 6R so as to cause them to be off only at the time of "out of tune".

And, the detection of tuning condition by an auto-tuning control system is carried out based on the output of the S-curve signal $V_s$ which is delivered from the IF amplifier-FM detector circuit 3.

On the other hand, sub-carrier signals $\phi_1$ and $\phi_2$ (38 kHz, $\phi_1 = \bar{\phi}_2$) which are necessary for the multiplex demodulation conducted in the multiplex demodulator circuit 4 are formed by a PLL circuit 11. This PLL circuit 11 is constructed by a phase-comparator circuit (hereinafter referred to breifly as PC) 14 for carrying out a comparison of phases between a pilot signal (19 kHz) derived from the composite signal via a band-pass filter (hereinafter referred to briefly as BPF) 12 and an output of a frequency divider circuit (hereinafter referred to briefly as DIV) 13 (which output is a signal obtained after dividing, into one half, sub-carrier signal $\phi_1$ or $\phi_2$), a VCO 15 for oscillating at 76 kHz when a phase-matching is detected by said PC 14, and a DIV 16 for dividing, into one half, the output frequency of this VCO 15 to form the sub-carrier signals $\phi_1$ and $\phi_2$ of 38 kHz, respectively.

Also, as for the discrimination of a stereophonic signal from a monaural signal, such discrimination is accomplished in a manner that the signal frequency of said sub-carrier-forming DIV 16 is subjected to a further division into one half by another DIV 17 to derive a signal $\phi_3$ (19 kHz) which is synchronous with the pilot signal, and that the composite signal is introduced into a synchronous detector circuit 18 for carrying out a synchronous detection by utilizing said signal $\phi_3$, and that the resulting 19 kHz component thus obtained is subjected to level discrimination at a monaural-stereo detector circuit 19, to drive a stereo-indicator 20 by an output of said detector circuit 19.

However, in the conventional FM stereophonic receiver using a central processing unit, there exist a number of sources of oscillation which individually oscillate signals in non-synchronous conditions relative to each other. Thus, there could often arise mutual interferences therebetween. Especially, owing to the interference occurring between the CPU-controlling clock pulse delivered from the quartz oscillator circuit 21 and the oscillation signal of the VCO 15 which is provided in the PLL circuit 11, there are often introduced noises into the sub-carrier signals $\phi_1$ and $\phi_2$, resulting in the degradation of the signal-to-noise ratio of the left-channel signal $L_0$ and the right-channel signal $R_0$ outputted from the multiplex demodualtor circuit 4.

Also, a conventional central processing unit which has been heretofore used for the purpose of controlling the selection of broadcasting stations operates in such manner that, once a tuning is established, it will output certain frequency-division data as stated above. Thus, unless re-tuning is established or a next operation is started, the required functions of this central processing unit will become limited thereto.

However, for example, if the operation is set so that, following the completion of tuning, the frequency-division data are stored in such section as a buffer memory, and that, after the tuning is established, the CPU is caused to function so as to extract a pilot signal which has conventionally been obtained by an exclusively-assigned PLL circuit 11, such arrangement of operation will result in a markedly efficient utilization of the CPU. Also, during non-tuned period (non-locked period), there is required no function of extracting pilot signal, and therefore, the CPU can concentrate a part of its functions only to the selection of broadcasting stations. The primary function of the CPU will never be impaired by the addition of said function to extract a pilot signal.

SUMMARY OF THE INVENTION

It is, therefore, a basic object of the present invention to provide an FM stereophonic receiver which uses a broadcasting station selecting CPU to concurrently serve for multiplex demodulation.

A first object of the present invention is to provide an FM stereophonic receiver of the type as described above, which simplifies the circuit arrangement of the receiver.

A second object of the present invention is to provide an FM stereophonic receiver of the type as described above, which is arranged so that a part of the functions of the PLL circuit intended primarily for multiplex demodulation is burdened by the broadcasting station selecting CPU.

A third object of the present invention is to provide an FM stereophonic receiver of the type as described above, which improves the signal-to-noise ratio of the multiplex demodulated signal.

A fourth object of the present invention is to provide an FM stereophonic receiver of the type as described above, which is arranged so that sub-carrier signals for multiplex demodulation are generated by the CPU which is primarily assigned to perform selection of broadcasting stations.

A fifth object of the present invention is to provide an FM stereophonic receiver of the type as described above, which is arranged so that a pilot signal is regenerated by the CPU intended for the selection of broadcasting stations.

A sixth object of the present invention is to provide an FM stereophonic receiver of the type as described above, which is arranged so that a clock pulse delivered from the broadcasting station selecting CPU is synchronized with a pilot signal contained in a composite signal to thereby generate the regenerated pilot signal or the sub-carrier signals.

DETAILED DESCRIPTION OF THE PREFERRED EMBODIMENT

Description will hereunder be made of a preferred embodiment of the present invention by referring to the accompanying drawing which is provided by way of example.

Figure 1:
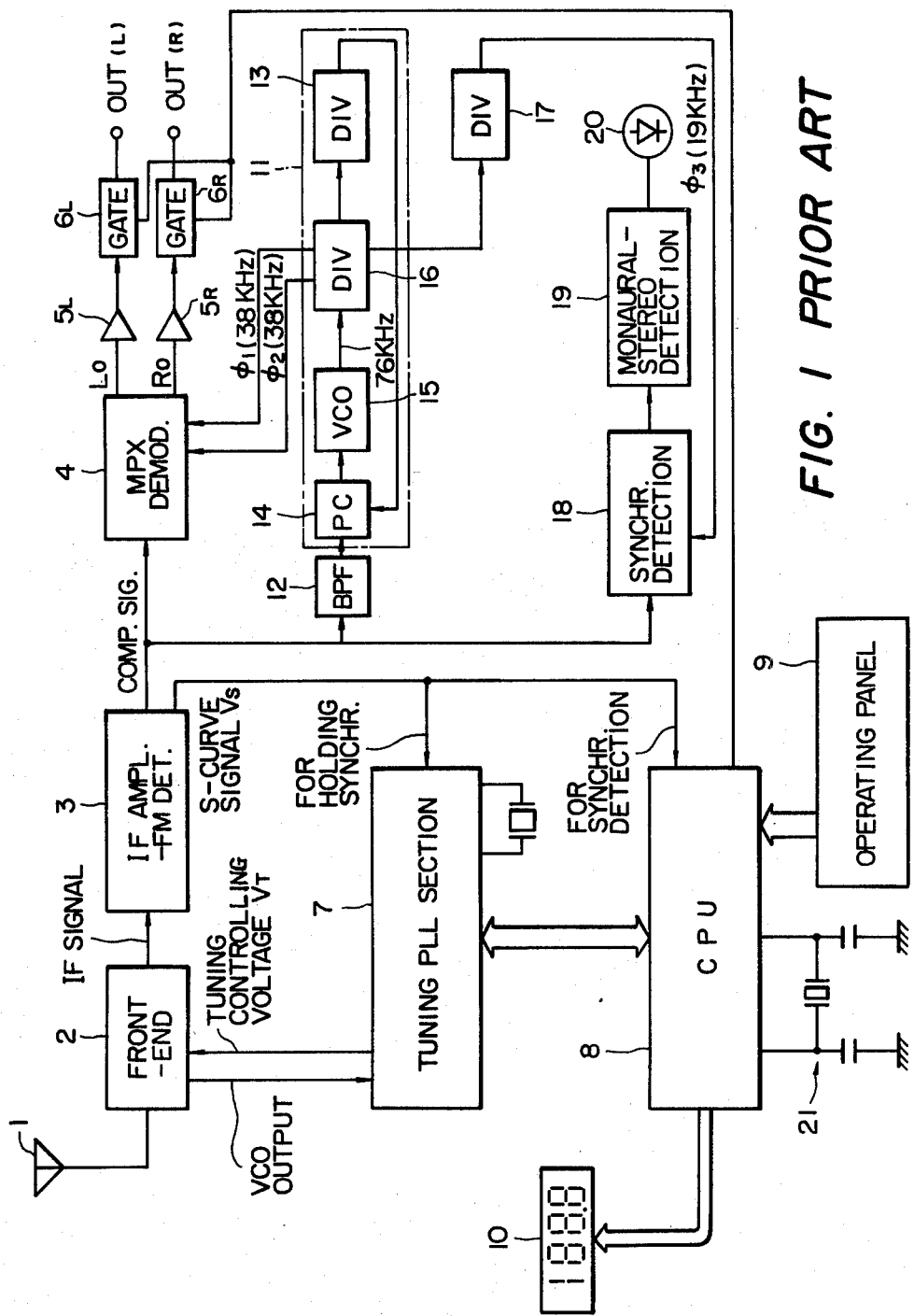
FIG. 1 is a block diagram of a conventional FM stereophonic receiver.
Figure 2:
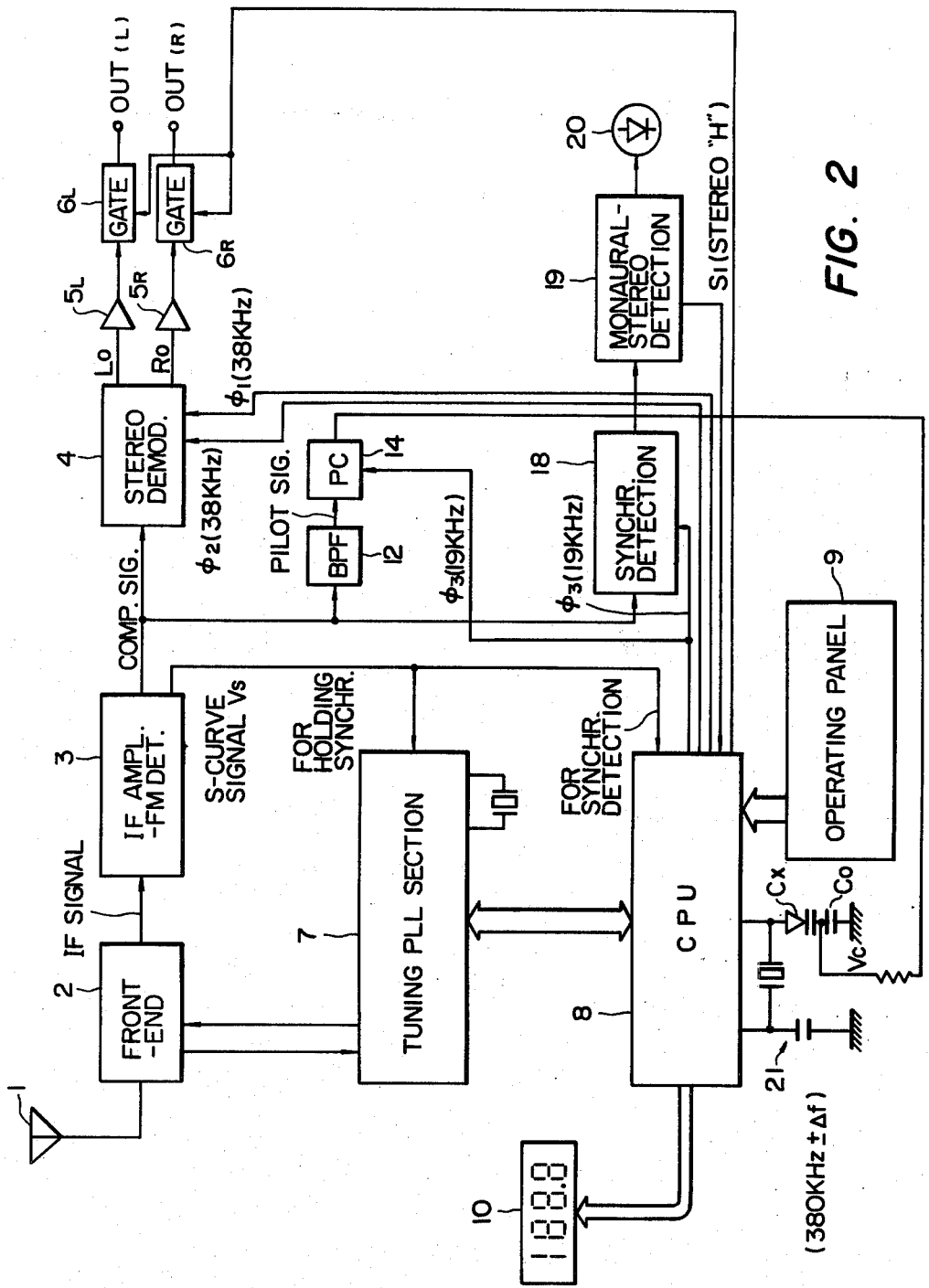
FIG. 2 is a block diagram of the FM stereophonic receiver according to the present invention.

FIG. 2 is a block diagram showing the circuit arrangement of the FM stereophonic receiver according to the present invention. In FIG. 2, parts similar to those shown in FIG. 1 are assigned like reference numerals and symbols, and their explanation is omitted.

Description will hereunder be made first to the general features of this embodiment. In the conventional FM stereophonic receiver arrangement shown in FIG. 1, arrangement is made so that sub-carrier signals $\phi_1$ and $\phi_2$ of 38 kHz as well as a synchronous detection signal $\phi_3$ of 19 kHz are obtained through appropriate frequency-dividing of an output of the VCO 15, and that the PLL circuit 11 is adapted to establish synchronism between a pilot signal (19 kHz) contained in a composite signal and these signals $\phi_1$, $\phi_2$ and $\phi_3$. In contrast thereto, in this embodiment, arrangement is provided so that the signals $\phi_1$, $\phi_2$ and $\phi_3$ are formed respectively by means of function (i.e. program-based processing) in a CPU 8, and that an output of the PC 14 is negatively fed back to a quartz oscillator circuit 21 of the CPU 8 to cause synchronization of said signals $\phi_1$, $\phi_2$ and $\phi_3$ with a pilot signal contained in a composite signal.

More particularly, a varicap diode $C_x$ is series-connected to a capacitor $C_o$ which is assigned for the determination of an oscillation frequency and which constitutes a quartz oscillator circuit 21 of the CPU 8. This varicap diode $C_x$ is so constructed that it can vary its capacitance value in accordance with the output $V_c$ of the PC 14. Accordingly, the oscillation frequency of the quartz oscillator circuit 21 will vary in accordance with the result of comparison of phases by the PC 14. Here, let us assume that when the result of phase comparison is demonstrated as "matched in phase", the quartz oscillator circuit 21 will oscillate at 380 kHz.

On the other hand, in the CPU 8, programming is so arranged that there can be obtained two outputs $\phi_1$ and $\phi_2$ (both being of 38 kHz) having a phase difference of 180° relative to each other and adapted to be inverted between "H" level and "L" level for every ten (10) clock pulses of the oscillating output of the quartz oscillator circuit 21, and this program is executed by the CPU 8. Concurrently therewith, programming is so set that there can be obtained an output $\phi_3$ (19 kHz) which is inverted between "H" level and "L" level for every twenty (20) clock pulses from the oscillator circuit 21, and this program is run also by the CPU 8. These outputs $\phi_1$ and $\phi_2$ are supplied, as sub-carrier signals, to a multiplex demodulator circuit 4, and the output $\phi_3$ is supplied to the PC 14 and to a synchronous detector circuit 18.

According to the above-mentioned arrangement, the signal $\phi_3$ (19 kHz) which is outputted from the CPU 8 is subjected normally to comparison, in the PC 14, of its phase relative to the pilot signal (19 kHz) which is extracted out of the composite signal via a BPF 12. The oscillation frequency of the oscillator circuit 21, upon its reception of the output of the PC 14, is so controlled to cause the abovesaid phase difference to become zero.

As a result, the phase of the signal $\phi_3$ (19 kHz) which is outputted from the CPU 8 is in exact agreement with the phase of the pilot signal (19 kHz) which is extracted out of the composite signal. In accordance therewith, the phases of those signals $\phi_1$ and $\phi_2$ (both being of 38 kHz) will also become in agreement with the phase of the pilot signal. Accordingly, the signals $\phi_1$ and $\phi_2$ will function as sub-carrier signals.

Thus, the composite signal which is outputted from the IF amplifier-FM detector circuit 3, upon its reception of the sub-carrier signals $\phi_1$ and $\phi_2$ of 38 kHz which are outputted from the CPU 8, are demodulated in the multiplex demodulator circuit 4 into a left-channel signal $L_0$ and a right-channel signal $R_0$, respectively, and also said composite signal, upon its reception of the signal $\phi_3$ of 19 kHz which is outputted from the CPU 8, will be subjected to synchronous detection in the synchronous detector circuit 18, and thus the presence or absence of the pilot signal is detected via a monaural-stereo detector circuit 19.

The monaural-stereo detector circuit 19 is so constructed to operate that, in case the pilot signal (19 kHz) is present, it lights up a stereo indicator 20, and also to output a stereo broadcast detection signal $S_1$ (which, at the time of stereophonic broadcast, is at "H" level). In the CPU 8, on the other hand, function is so arranged to be operative that the state of the signal $S_1$ is subjected to vigilance at a certain cycle and that the information of this vigilance is stored in a predetermined register and further that the registered information will function as a conditional flag for the determination of permission or inhibition of delivery of outputs of the sub-carrier signals $\phi_1$ and $\phi_2$.

Accordingly, when the value of the output signal $S_1$ of the monaural-stereo detector circuit 19 changes from "H" level to "L" level owing to the fact that the pilot signal has no longer become present in the composite signal, the sub-carrier signals $\phi_1$ and $\phi_2$ which have till then been outputted will now become inhibited of their delivery.

As described above, the clock pulse frequency outputted from the CPU 8 in this embodiment will unfailingly assume a value which is a multiplication by an integer (in this embodiment, it is ten (10)) of the frequency of the sub-carrier signals $\phi_1$ and $\phi_2$, and also the timing of said sub-carrier signals $\phi_1$ and $\phi_2$ will unfailingly agree with the timing of said clock pulse. As a result, the interference (beat interference) between the clock pulse of the CPU 8 and the sub-carrier signals $\phi_1$ and $\phi_2$ which has been a problem in the past is eliminated, and thus the signal-to-noise ratio of the demodulated outputs, i.e. left-channel signal $L_0$ and right-channel signal $R_0$, of the multiplex demodulator circuit 4 will be markedly improved. Furthermore, because of the arrangement that sub-carrier signals $\phi_1$ and $\phi_2$ are generated by means of the function of CPU on the basis of the clock pulse of CPU 8 serving as the reference pulse, it will be understood that there is no need of provision of such circuits as VCO and DIV which, in the past, have been necessary for the generation of sub-carrier signals. Also, the generation of sub-carrier signals can be controlled by a simplified function of CPU.

It should be noted here that programming is set so that when the CPU 8 functions for the tuning of frequency, it does not operate to generate said signals $\phi_1$, $\phi_2$ and $\phi_3$, and that upon completion of tuning, it causes such means as the buffer memory to store the then frequency-dividing data for the tuning PLL section 7, and thereafter the CPU 8 will start its operation to generate the signals $\phi_1$, $\phi_2$ and $\phi_3$.

Further, the programming is set so that when a tuning mode, for example, a preset tuning mode or a auto-tuning mode is set by the operation of the operating panel 9, which is detected by its interrupting, it causes the CPU 8 to terminate to operate as a generator of the signals $\phi_1$, $\phi_2$ and $\phi_3$ and to commence to operate as a frequency-dividing-data generator for the tuning operation.

Also, the CPU 8 executes the frequency-dividing-data-determining program upon its reception of a clock pulse from the quartz oscillator circuit 21 having a varicap diode. It should be noted, however, that even when the clock pulse frequency varies, the program-running rate of the CPU 8 can vary only somewhat, and there arises no trouble therefrom.

What is claimed is:

1. An FM stereophonic receiver, comprising:
   a front end for converting an input signal provided to an antenna into an intermediate frequency signal;
   central processing unit means engaged in selection of a broadcasting station in said front end, said central processing unit providing a generated pilot signal;
   IF amplifier-FM detection means for amplifying said intermediate frequency signal and for FM-detecting thereof to output a composite signal which includes a pilot signal;
   pilot signal extracting means for extracting said pilot signal out of said composite signal;
   phase comparision means for comparing a phase of said extracted pilot signal relative to a phase of said generated pilot signal;
   clock pulse signal generating means for receiving an output signal from said phase comparison means to determine a clock frequency for use in said central processing unit means, said central processing unit means receiving a clock pulse signal from said clock pulse signal generating means and generating as a function thereof sub-carrier signals and said generated pilot signal which are synchronized with the extracted pilot signal; and
   multiplex demodulation means for demodulating said composite signal into a left-channel signal and a right-channel signal by said sub-carrier signals.

2. An FM stereophonic receiver according to claim 1, wherein said clock pulse signal generating means comprises:
   quartz oscillation circuit means containing a varicap diode means capable of varying its capacitance value in accordance with an output signal delivered from said phase comparison means.

3. An FM stereophonic receiver according to claim 1, wherein said clock pulse signal generating means generates the clock pulse signal having a frequency representing a multiplication by an integer relative to a frequency of said generated pilot signal and to a frequency of said sub-carrier signals.

4. An FM stereophonic receiver according to claim 1, further comprising:
   stereo-monaural discrimination means for detecting a presence or absence of said pilot signal in said composite signal and for driving a stereo-indicator means based on a result of the detection.

5. An FM stereophonic receiver according to claim 4, wherein said stereo-monaural discrimination means comprises:
   synchronism detection circuit means for receiving said generated pilot signal from said central processing unit means to extract the pilot signal out of said composite signal; and
   stereo-monaural detection circuit means for detecting a stereophonic broadcast condition or a monaural broadcast condition in accordance with said pilot signal delivered from said synchronism detection circuit means.

6. An FM stereophonic receiver according to claim 4, wherein
   said central processing unit means inhibits the outputting, upon detection of a monaural broadcast condition by said stereo-monaural discrimination means, of said generated pilot signal and said sub-carrier signals.

7. An FM stereophonic receiver according to claim 1, further comprising:
   tuning PLL means for determining a tuning frequency in said front end in accordance with frequency dividing data delivered from said central processing unit means.

8. An FM stereophonic receiver according to claim 7, further comprising:

operating panel means for providing control signals for determining said frequency dividing data of said central processing unit means.

9. An FM stereophonic receiver according to claim 7, further comprising:
frequency indicator means for displaying a frequency of a received input signal in accordance with said frequency dividing data delivered from said central processing unit means.

10. An FM stereophonic receiver according to claim 1, further comprising:
muting gate means inserted in respective left-channel and right-channel stereophonic outputs of said multiplex demodulation means and adapted to be closed and opened by said central processing unit means.

11. An FM stereophonic receiver according to claim 10, wherein
said muting gate means are adapted to be opened upon lack of tuning, and closed upon establishment of tuning, by said central processing unit means.

12. An FM stereophonic receiver comprising:
a tuning section;
a multiplex demodulator controlled by sub-carrier signals, said demodulator receiving a composite signal including a pilot signal;
a clock controlled central processor for controlling the tuning of the tuning section and for generating the sub-carrier signals; and
phase control means for varying the frequency of the clock signal to the central processor to cause the sub-carrier signals to be synchronized with the pilot signal.

* * * * *